(12) United States Patent
Okumura et al.

(10) Patent No.: US 8,304,899 B2
(45) Date of Patent: Nov. 6, 2012

(54) ELEMENT WAFER AND METHOD FOR MANUFACTURING THE SAME

(75) Inventors: Mika Okumura, Tokyo (JP); Makio Horikawa, Tokyo (JP); Kimitoshi Satou, Tokyo (JP); Yasuo Yamaguchi, Tokyo (JP)

(73) Assignee: Mitsubishi Electric Corporation (JP)

( * ) Notice: Subject to any disclaimer, the term of this patent is extended or adjusted under 35 U.S.C. 154(b) by 728 days.

(21) Appl. No.: 12/172,603

(22) Filed: Jul. 14, 2008

(65) Prior Publication Data

US 2009/0230485 A1    Sep. 17, 2009

(30) Foreign Application Priority Data

Mar. 17, 2008   (JP) ................... 2008-067786

(51) Int. Cl.
   *H01L 23/31* (2006.01)
(52) U.S. Cl. ........ 257/725; 257/415; 257/684; 257/692; 257/E29.342; 257/E23.031
(58) Field of Classification Search .................. 257/415, 257/684, 692, 725, E23.031, E29.342
   See application file for complete search history.

(56) References Cited

U.S. PATENT DOCUMENTS

| | | | |
|---|---|---|---|
| 6,988,407 B2 | 1/2006 | Yamaguchi et al. | |
| 7,041,593 B2 | 5/2006 | Okumura et al. | |
| 2004/0187555 A1* | 9/2004 | Zarabadi | 73/1.37 |
| 2007/0102831 A1* | 5/2007 | Machida et al. | 257/787 |
| 2009/0145225 A1* | 6/2009 | Nasiri et al. | 73/514.02 |

FOREIGN PATENT DOCUMENTS

| | | |
|---|---|---|
| DE | 41 26 100 A 1 | 2/1993 |
| DE | 101 30 713 A 1 | 1/2002 |
| JP | 2-30132 | 1/1990 |
| JP | 6-45315 | 2/1994 |
| JP | 7-45560 | 2/1995 |
| JP | 2005-72538 | 3/2005 |
| JP | 2005-123263 | 5/2005 |
| JP | 2005-172543 | 6/2005 |
| JP | 2005-217320 | 8/2005 |
| KR | 10-2003-0059167 A | 7/2003 |
| KR | 10-2005-0025224 A | 3/2005 |
| WO | WO 02/103808 A1 | 12/2002 |
| WO | 2007/057814 A2 | 5/2007 |
| WO | WO 2007057814 A2 * | 5/2007 |

OTHER PUBLICATIONS

Office Action issued Sep. 30, 2010 in German Application No. 10 2008 037 947.6 (With English Translation).

(Continued)

*Primary Examiner* — Minchul Yang
(74) *Attorney, Agent, or Firm* — Studebaker & Brackett PC; Donald R. Studebaker; John F. Guay

(57) ABSTRACT

A recessed portion is provided in first and second insulating films, the first insulating film being stacked on a semiconductor wafer, the second insulating film being stacked on the first insulating film. The first and second insulating films are processed to form wiring in a formation region of the semiconductor wafer in which an acceleration sensor is to be formed. After a sacrificial film is stacked on the wiring and processed, a conductive film is stacked on the wiring and processed to form a plurality of thin film structures in the formation region. The recessed portion surrounds the formation region.

9 Claims, 12 Drawing Sheets

OTHER PUBLICATIONS

English translation of the Korean Office Action dated Aug. 31, 2011; Korean Application No. 10-2008-0098044.

The Office Action issued by the German Patent Office on Jan. 10, 2012; German Patent Application No. 10 2008 037 947.6 with translation.

The Opinion on Examination (Notification) from the Intellectual Property Office issued on Dec. 23, 2011; Taiwanese Patent Application No. 10021162280; with translation.

The Korean Office Action "The Decision of Rejection" dated Mar. 26, 2012; Korean Patent Application No. 10-2008-0098044; with translation.

Third Opinion on Examination issued from the State Intellectual Property Office of the People's Republic of China on Jan. 31, 2012; Chinese Patent Application No. 200810166473.3; with translation.

* cited by examiner

A-A'

B - B'

X - X'

A — A'

ELEMENT WAFER AND METHOD FOR MANUFACTURING THE SAME

FIELD OF THE INVENTION

The present invention relates to an element wafer and a method for manufacturing the element wafer.

BACKGROUND ART

Each of the following patent documents discloses a method for forming a semiconductor element on a semiconductor wafer.

Patent Document 1: JP-A-1990-30132
Patent Document 2: JP-A-2005-217320
Patent Document 3: JP-A-2005-123263
Patent Document 4: JP-A-1995-45560
Patent Document 5: JP-A-1994-45315
Patent Document 6: JP-A-2005-72538
Patent Document 7: International Publication No. 2002-103808

A conventional method for forming an element having a minute structure with a movable portion, such as an acceleration sensor, is to stack a plurality of films having different materials and thicknesses on a semiconductor wafer and process the films. The present inventor(s) found out that a crack may occur in the films due to stresses present in the films when the films are stacked. If the crack propagates into the semiconductor wafer, a film on or above which the element is to be formed will be damaged, or the element itself will be damaged.

In recent years, after elements such as acceleration sensors are formed on semiconductor wafers, business transactions involving sales of the wafers have been performed without dicing the wafer. Therefore, it is desirable to take measures to prevent such a crack in a process for manufacturing a semiconductor wafer (hereinafter also referred to as an element wafer) having an element formed thereon.

SUMMARY OF THE INVENTION

It is, therefore, an object of the present invention to provide a method for manufacturing an element wafer that enables suppressing damage due to a crack to a region of films on the semiconductor wafer in which an element is formed.

In addition, another object of the present invention is to provide an element wafer capable of suppressing damage due to a crack to an element formed on the semiconductor wafer.

According to a first aspect of the present invention, a method for manufacturing an element wafer, includes the steps of: preparing a semiconductor wafer; stacking a plurality of films on the semiconductor wafer and oncurrently processing each of the films to form an element in a central region of the plurality of films on the semiconductor wafer; and forming a recessed portion and/or a plurality of openings in at least one of the plurality of films, the recessed portion and the openings being arranged outside the central region and surrounding the central region.

According to a second aspect of the present invention, a method for manufacturing an element wafer, includes the steps of: preparing a semiconductor wafer; stacking a plurality of films on the semiconductor wafer and concurrently processing each of the films to form a plurality of elements side by side in a predetermined region of the films stacked on the semiconductor wafer; and forming recessed portions in at least one of the films excluding the top film of the plurality of films to partition the elements from each other.

According to a third aspect of the present invention, an element wafer includes: a semiconductor wafer; a film stacked on the semiconductor wafer; and an element provided on a central region of the film stacked on the semiconductor wafer. Further, in the third aspect of the present invention, a plurality of films including the film are stacked in the outer region of the semiconductor wafer, the outer region being located outside of the central region, and a recessed portion and/or a plurality of openings are provided in at least one of the films stacked in the outer region of the semiconductor wafer. The recessed portion and/or the plurality of openings is/are arranged outside the central region and surround(s) the central region.

According to a fourth aspect of the present invention, an element wafer includes: a semiconductor wafer; an insulating film stacked on the semiconductor wafer; plural pieces of wiring provided on a central region of the insulating film stacked on the semiconductor wafer; and a plurality of thin film structures provided on and connected with the respective pieces of the wiring. Further, in the forth aspect of the present invention, recessed portions are provided in the insulating film to partition the thin film structures from each other.

According to a fifth aspect of the present invention, an element wafer includes: a semiconductor wafer; an insulating film stacked on the semiconductor wafer; plural pieces of wiring provided on a central region of the insulating film stacked on the semiconductor wafer; a sacrificial film stacked on the insulating film and the wiring and having a plurality of openings formed therein, the opening exposing the respective pieces of the wiring; and a plurality of thin film structures provided on the sacrificial film and connected with the respective pieces of the wiring through the openings. Further, in the fifth aspect of the present invention, recessed portions are provided in the sacrificial film to partition the thin film structures from each other.

The features and advantages of the present invention may be summarized as follows.

According to the first aspect of the present invention, a recessed portion and/or a plurality of openings can be formed so as to surround a region of a plurality of films on a semiconductor wafer in which an element is located or to be located. The recessed portion and/or the plurality of openings serve to prevent cracks from propagating into the central region in which the element is located even if the cracks occur in several of the films from the outer side of the semiconductor wafer.

According to the second aspect of the present invention, recessed portions can be formed so as to partition elements formed above the semiconductor wafer from each other. Even when a crack occurs in a region of the films on the semiconductor wafer in which an element is located, the recessed portions serve to prevent the crack from spreading within the region in which the element is located.

According to the third aspect of the present invention, even when a crack occurs in a region on the outer side of the element wafer, the crack cannot propagate into the region of the semiconductor wafer in which an element is present.

According to the fourth aspect of the present invention, even when a crack occurs in the region of the semiconductor wafer in which an element is present, the crack cannot spread within that region.

According to the fifth aspect of the present invention, even when a crack occurs in the region of the semiconductor wafer in which an element is present, the crack cannot spread within that region.

Other and further objects, features and advantages of the invention will appear more fully from the following description.

DETAILED DESCRIPTION OF THE PREFERRED EMBODIMENTS

[Manufacturing Method as a Premise of Embodiments of the Present Invention]

Prior to descriptions of the embodiments of the present invention, a description will be made of a method for manufacturing an acceleration sensor as a premise of the embodiments of the present invention. In the manufacturing method, a plurality of films are stacked on a semiconductor wafer, and an etching process, a planarization process or the like is performed on each film in order to form an acceleration sensor above the semiconductor wafer. It should be noted that the manufacturing method to be described herein will be given as the premise of the embodiments of the present invention. The present invention is therefore not limited to steps and processes of the manufacturing method to be described as the premise of the embodiments of the present invention.

FIGS. 19 to 27 are diagrams showing processes of the manufacturing method to be described as the premise of the embodiments of the present invention. An acceleration sensor to be manufactured by the manufactured method includes wiring and a thin film structure provided on the wiring. The thin film structure has a support portion and a floating portion. The support portion is connected to the wiring. The floating portion is supported by the support portion and movable. Although the following description is made of processes for forming a single acceleration sensor, the actual processes are performed on a plurality of regions of an upper surface of the semiconductor wafer. In the actual processes, a plurality of the acceleration sensors is thus to be formed side by side on a central region present on the upper surface of the semiconductor wafer.

Figure 19:
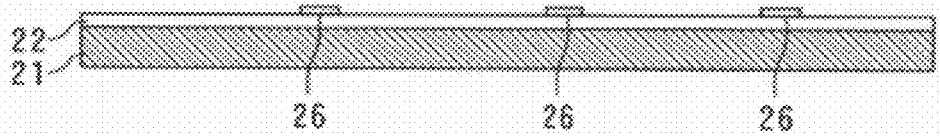
FIG. 19 is a diagram showing processes of the manufacturing method to be described as the premise of the embodiments of the present invention.

First, a first insulating film 22 is stacked on an upper surface of a semiconductor wafer 21 as shown in FIG. 19. The first insulating film 22 has a thickness of 2 μm. A conductive material is formed in a predetermined pattern on the first insulating film 22 to provide wiring 26. After the formation of the conductive material, the structure shown in FIG. 19 is obtained. The semiconductor wafer 21 is made of a silicon-based material. The first insulating film 22 is a thermally oxidized film.

Figure 20:
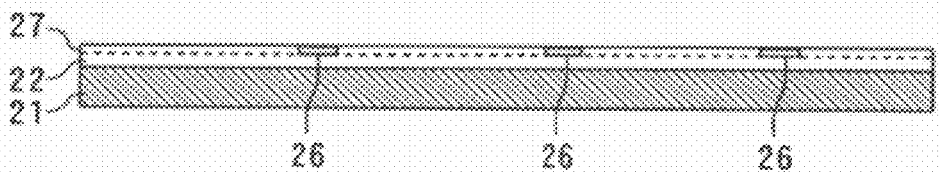
FIG. 20 is a diagram showing processes of the manufacturing method to be described as the premise of the embodiments of the present invention.

Next, a second insulating film 27 is stacked to a thickness of 0.5 μm on the structure shown in FIG. 19. The second insulating film 27 is processed in a planarization process to ensure that an upper surface of the second insulating film 27 is substantially flush with upper surfaces of the wiring 26. After the planarization process, the structure shown in FIG. 20 is obtained, in which the wiring 26 is embedded in the second insulating film 27. The second insulating film 27 is a tetraethyl orthosilicate (TEOS) film.

Figure 21:
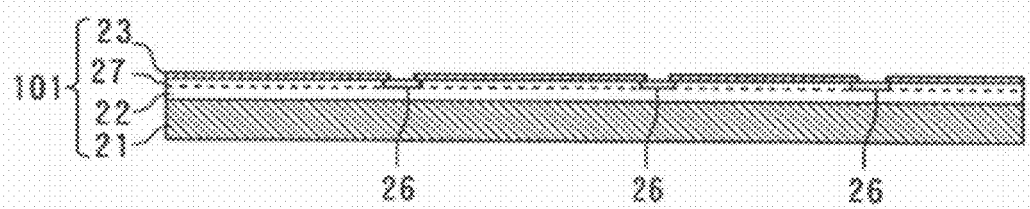
FIG. 21 is a diagram showing processes of the manufacturing method to be described as the premise of the embodiments of the present invention.

Then, a nitride film is stacked on the structure shown in FIG. 20 to form a third insulating film 23. The third insulating film 23 has a thickness of 0.2 μm. Portions of the third insulating film 23 under which the wiring 26 is present are removed to provide through-holes. As a result, the upper surface of the wiring 26 is exposed as shown in FIG. 21. After the removal of the portions of the third insulating film 23, the structure shown in FIG. 21 is obtained. Hereafter, the structure shown in FIG. 21 is also referred to a substrate 101.

Figure 22:
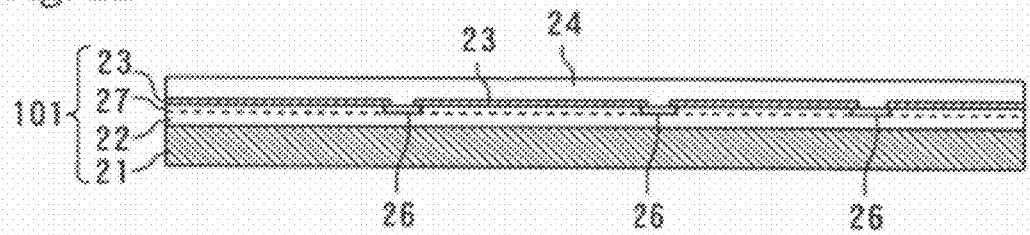
FIG. 22 is a diagram showing processes of the manufacturing method to be described as the premise of the embodiments of the present invention.
Figure 23:
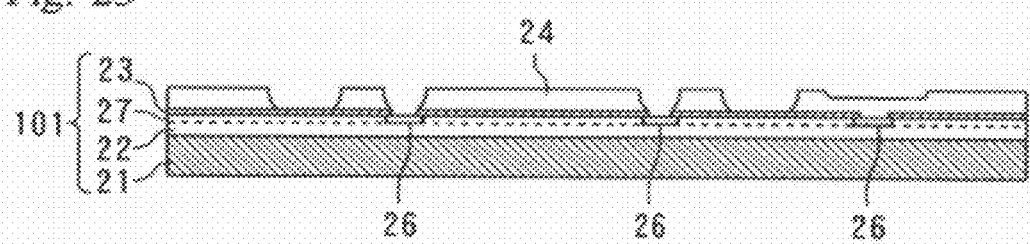
FIG. 23 is a diagram showing processes of the manufacturing method to be described as the premise of the embodiments of the present invention.

Then, a sacrificial film 24 is stacked to a thickness of 2 μm on the structure shown in FIG. 21. After the process for stacking the sacrificial film 24, the structure shown in FIG. 22 is obtained. The sacrificial film 24 is a phosphorus silicate glass (PSG) film. Then, portions of the sacrificial film 24 under which the wiring 26 is present are removed to provide through-holes. After the removal of the portions of the sacrificial film 24, the structure shown in FIG. 23 is obtained. The through-holes provided in the sacrificial film 24 serve to connect the wiring 26 and the thin film structure, which is to be formed in a subsequent process described later. The holes provided in the sacrificial film 24 are also called anchor holes.

Figure 24:
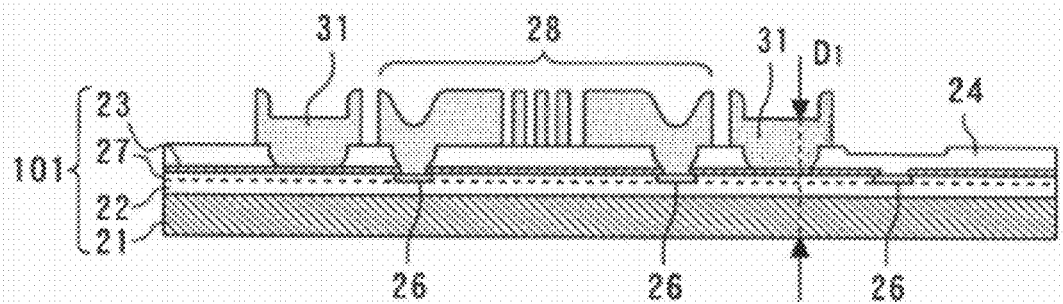
FIG. 24 is a diagram showing processes of the manufacturing method to be described as the premise of the embodiments of the present invention.

Then, a conductive film (a doped polysilicon film is used in this case) is stacked to a thickness of 8 μm on the structure shown in FIG. 23. The conductive film is processed to form a thin film structure 28 and a sealing portion 31. After the formation of the thin film structure 28 and the sealing portion 31, the structure shown in FIG. 24 is obtained. Hereafter, the conductive film is also called a "structural thick film." After the sacrificial film 24 is removed, the thin film structure 28 serves eventually as a movable portion of the acceleration sensor. Specifically, a portion of the thin film structure 28 under which the sacrificial film 24 is present serves as the movable structural portion (hereinafter, also referred to as a "floating portion"). Another portion of the thin film structure 28 that is connected with the wiring 26 through the anchor hole serves as a structural portion supporting the floating portion on the substrate 101 (hereinafter, also referred to as a "support portion"). In the manufacturing method as the premise of the embodiments of the present invention as described above, the films are stacked on the semiconductor wafer 21 and subjected to the respective processes to form an acceleration sensor 20 above the semiconductor wafer 21.

After the sacrificial film 24 is removed, a cap member is attached to the sealing portion 31 and serves to protect the thin film structure 28. In other words, the sealing portion 31 serves as an adhesive to fix the cap member. The cap member may be formed of silicon or glass. The structures of such a cap member and sealing portion are disclosed in JP-A-2005-172543.

Figure 25:
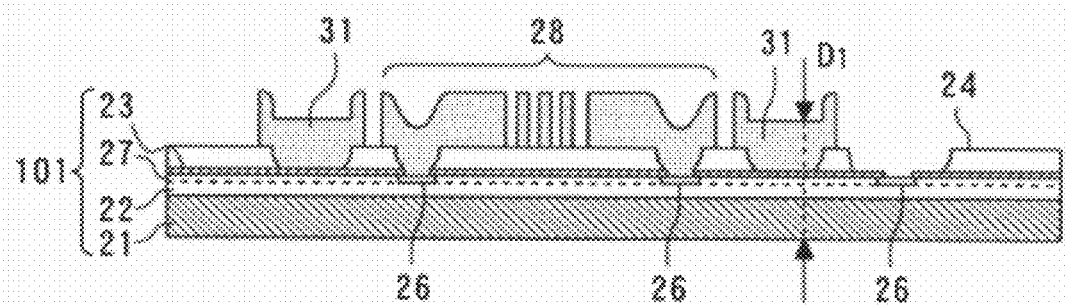
FIG. 25 is a diagram showing processes of the manufacturing method to be described as the premise of the embodiments of the present invention.
Figure 26:
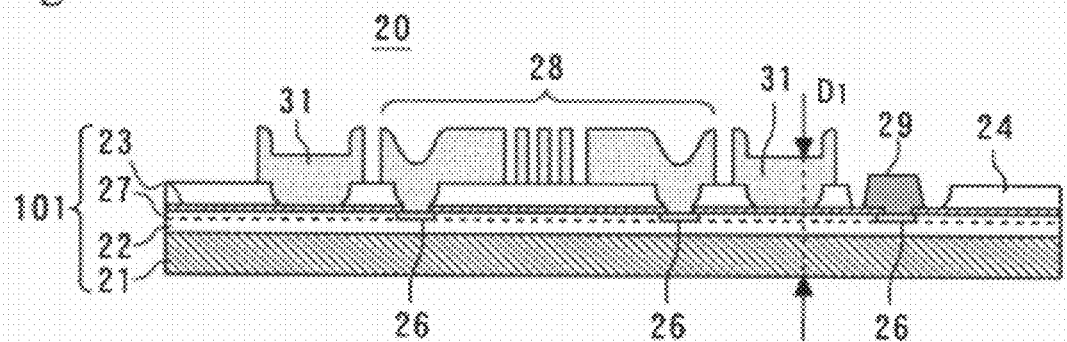
FIG. 26 is a diagram showing processes of the manufacturing method to be described as the premise of the embodiments of the present invention.

Then, an electrode pad is formed on the structure shown in FIG. 24. Prior to the formation of the electrode pad, a portion of the sacrificial film 24 at which the electrode pad is to be provided is removed by etching. In this manufacturing method, the portion of the sacrificial film 24 under which the rightmost wiring 26 is present is removed as shown in FIG. 25. Then, an Al—Si film is formed by sputtering and patterned to form an electrode pad 29 shown in FIG. 26. After that, a process is performed to remove the sacrificial film 24 (this process is also called a release process). Then, a dicing process is performed to complete the acceleration sensor 20. It should be noted that the structure immediately before the removal of the sacrificial film 24 that is to become the acceleration sensor 20 is also called the acceleration sensor 20 for convenience.

FIGS. 19 to 26, which are described above, show the processes for forming the acceleration sensor 20 on a central region of the substrate 101. On the other hand, the thin film structure 28 and the sealing portion 31 are not formed on the outer side (outer edge) of the substrate 101.

Figure 27:
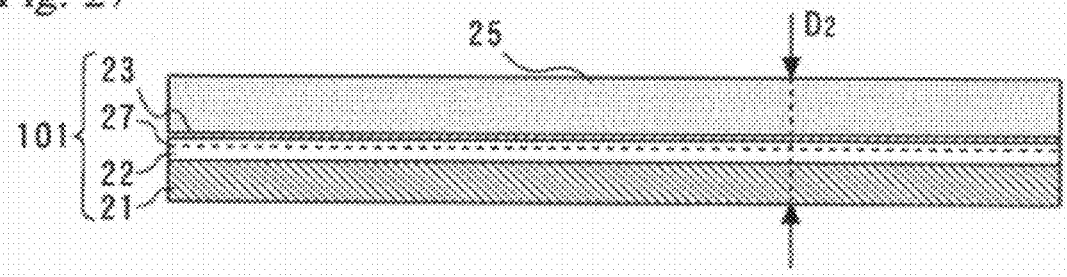
FIG. 27 is a diagram showing processes of the manufacturing method to be described as the premise of the embodiments of the present invention.

In the manufacturing method as the premise of the embodiments of the present invention, as shown in FIG. 27, a film is stacked in a region on the outer side of the substrate 101. FIG. 27 shows a laminated structure that is formed in the outer region of the semiconductor wafer 21 (the outer side of the substrate 101) while the processes described with reference to FIGS. 19 to 26 are performed. While the processes described with reference to FIGS. 19 to 21 are performed, the first to third insulating films 22, 27 and 23 are formed in the outer region of the semiconductor wafer 21. After that, the sacrificial film 24 is not formed in the outer region of the semiconductor wafer 21 in the processes of FIGS. 22 and 23. After the process described with reference to FIG. 24 is performed, the structural thick film is stacked also on the outer side of the semiconductor wafer 21. The structural thick film that is stacked on the third insulating film 23 as shown in FIG. 27 is called a conductive film 25 for convenience.

As described above, the cap member for the acceleration sensor 20 is attached to the sealing portion 31. A plurality of the cap members is provided to form a single plate (hereinafter also called a cap plate). The cap plate is attached to the semiconductor wafer 21 above which the acceleration sensors 20 are provided. The cap plate is in contact with the sealing portion 31 of each of the acceleration sensors 20 and with the laminated structure (shown in FIG. 27) provided in the outer region of the semiconductor wafer 21. Thus, the laminated structure provided in the outer region of the semiconductor wafer 21 also serves as an adhesive in the process for fixing the cap members.

The sealing portion 31 of each of the acceleration sensors 20 and the laminated structure provided in the outer region of the semiconductor wafer 21 serve as adhesives. Thus, the sealing portion 31 of each of the acceleration sensors 20 and the laminated structure are formed to have the same height (the same thickness). As apparent from a comparison between FIGS. 26 and 27, the thickness D1 of the sealing portion 31 and the thickness D2 of the laminated structure shown in FIG. 27 are the total of the thicknesses of the semiconductor wafer 21, the first insulating film 22, the second insulating film 27, the third insulating film 23 and the structural thick film (the conductive film 25 shown in FIG. 27).

In the above-described manufacturing method as the premise, the first insulating film 22, the sacrificial film 24, and the structural thick film are each formed to have a thickness of 1 μm or more. Especially, the structural thick film is formed thick to have several μm to several tens of μm. Such a thick film is often stacked on a wafer to form an element having a structure with a movable portion, such as the acceleration sensor 20. In contrast, a typical semiconductor element is formed of laminated films each having a thickness of 0.5 μm to 1 μm.

Each of the films located between the first insulating film 22 and the structural thick film including those films themselves has an internal stress. The directions and intensities of the stresses are different depending on the material of the film and the atmosphere used in the formation process. The first and second insulating films 22 and 27 and the structural thick film have compressive stresses, while the third insulating film 23 and the sacrificial film 24 have tensile stresses. There is a tendency that a film formed in an oxidative atmosphere has an internal compressive stress, and a film formed in a nitriding atmosphere has an internal tensile stress. Such stresses may cause films to be bent. A film having a compressive stress and a film having a tensile stress are bent in directions opposite to each other.

As films are stacked on the semiconductor wafer 21, stresses present in the films are accumulated. Eventually, the entire stress of the multiple films stacked on the semiconductor wafer 21 becomes large. Thus, a force to warp the films also becomes large. As a result, the force may cause the semiconductor wafer 21 to be warped. In addition, in the processes for stacking the sacrificial film 24 having a thickness of several μm and the structural thick film having a larger thickness than that of the sacrificial film 24, stresses present in the stacked films are particularly large.

The present inventor(s) found out that a crack may occur in the stacked films from the outer side of the semiconductor wafer 21 when stresses present in each of the films accumulates. When the crack develops from the outer side of the semiconductor wafer 21 to the central side thereof, the crack may reach a region at which the acceleration sensor is located. The crack may further develop to reach the upper surface of the semiconductor wafer 21 through the first to third insulating films 22, 27 and 23, damaging the semiconductor wafer 21. The above-mentioned situations may cause an electrical leakage or the like, resulting in degraded reliability of the acceleration sensor.

The above description has been made of the manufacturing method as the premise of the embodiments of the present invention and the problems found out by the present inventor(s). Next, descriptions will be made of the embodiments of the present invention made to solve the problems.

First Embodiment

According to a first embodiment of the present invention, provided in laminated films is a recessed portion that surrounds a region of the laminated films on a semiconductor wafer in which an element is to be formed. First, a description will be made of a semiconductor wafer (also called an "element wafer") according to the first embodiment, on which an acceleration sensor is formed. After that, a description will be made of a method for manufacturing the element wafer of the first embodiment.

[Construction of the Element Wafer According to the First Embodiment]

Figure 1:
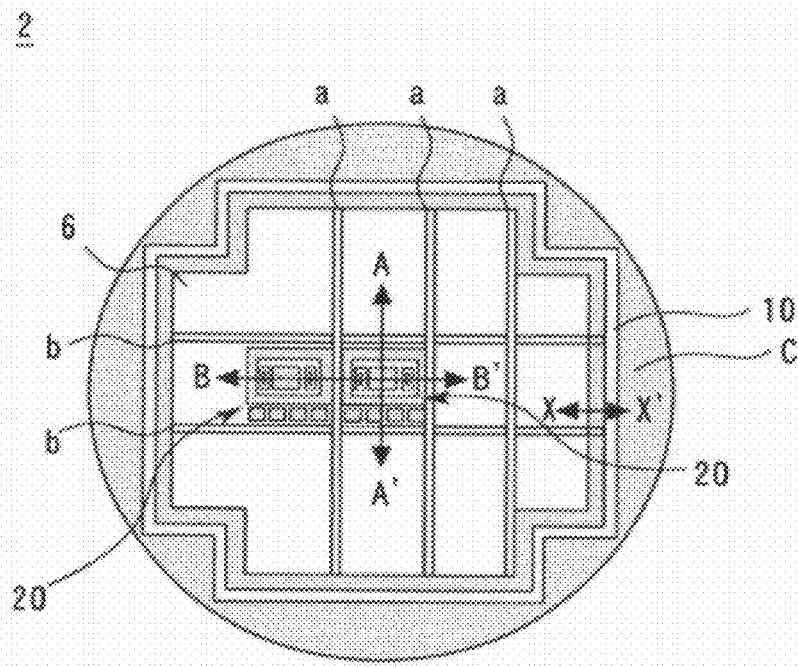
FIG. 1 is a plan view of an element wafer according to the first embodiment.

FIG. 1 is a plan view of an element wafer 2 according to the first embodiment. As shown in FIG. 1, a plurality of the acceleration sensors 20, which are formed in the processes of FIGS. 19 to 26 as described above, are provided above the element wafer 2. The acceleration sensors 20 are located in the region indicated by reference numeral 6. The region of the element wafer 2 on which the acceleration sensors 20 are provided is hereinafter also called a formation region 6. In FIG. 1, two of the acceleration sensors 20 are shown for convenience. However, more of the acceleration sensors 20 are provided in the entire formation region 6.

A region of the element wafer 2 that is present outside of the formation region 6, i.e., the outer region of the element wafer 2, is hereinafter also called a region C. In the processes shown in FIGS. 19 to 26, the films are stacked also on the region C.

The region C of the element wafer 2 is provided with a recessed portion 10 that surrounds the formation region 6. The recessed portion 10 prevents a crack that occurs in the outer region of the element wafer 2 from reaching the formation region 6. In other words, the recessed portion 10 is a groove extending outside of the formation region 6 and surrounding the formation region 6.

In FIG. 1, reference symbols a and b denote dicing lines. The element wafer 2 is eventually diced along the dicing lines a and b to be separated into the acceleration sensors 20.

Figure 2:
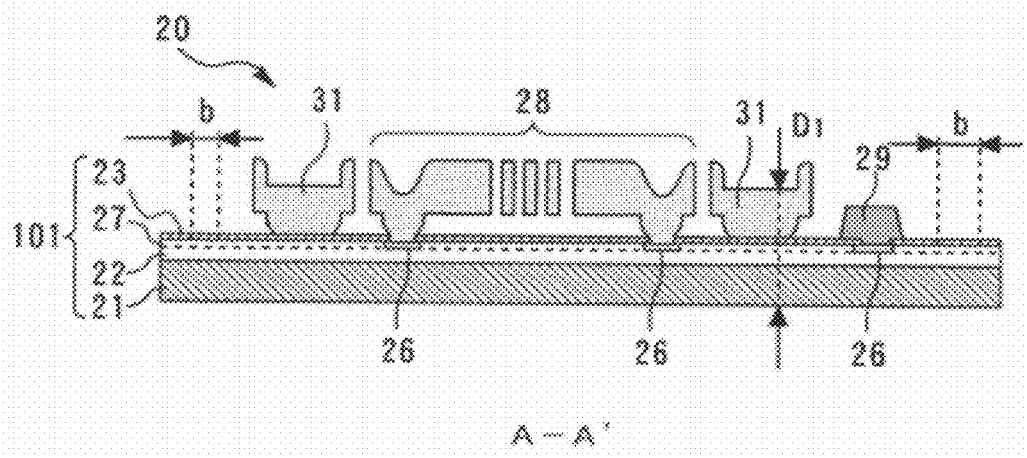
FIG. 2 is a cross-sectional view of the element wafer taken along the line A-A' of FIG. 1.

FIG. 2 is a cross-sectional view of the element wafer 2 taken along the line A-A' of FIG. 1. FIG. 2 shows a state obtained after the sacrificial film 24 is removed and before the dicing process is performed. In FIG. 2, the same reference numerals are used for items which are identical to those mentioned in the manufacturing method as the premise of the embodiments of the present invention. In FIG. 2, a part of the thin film structure 28 looks in a floating state. The seemingly floating portion, however, extends in the directions of the line B-B' of FIG. 1 and is integrated with other portions of the thin film structure 28. This thin film structure is one of the structures used in known acceleration sensors, and a detailed description thereof is thus omitted. In FIG. 2, the locations of the dicing lines b are also shown.

Figure 3:
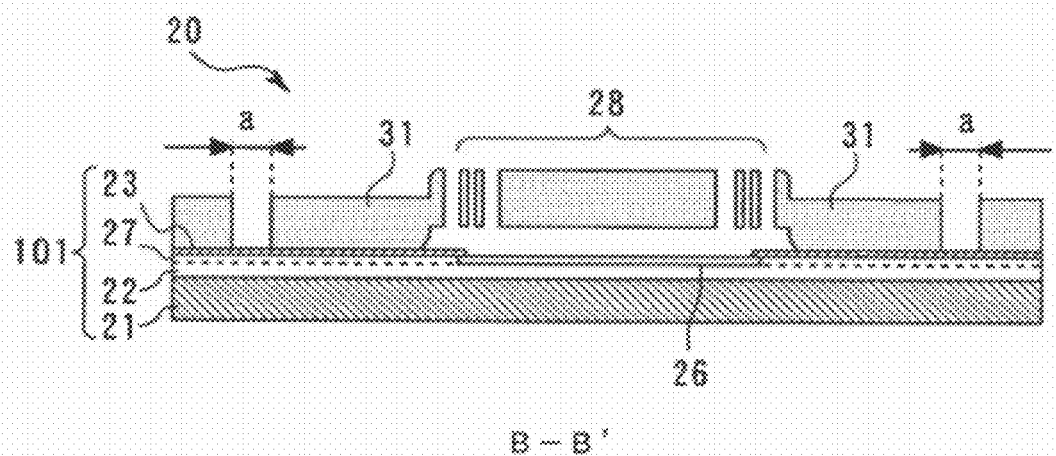
FIG. 3 is a cross-sectional view of the element wafer taken along the line B-B' of FIG. 1.

FIG. 3 is a cross-sectional view of the element wafer 2 taken along the line B-B' of FIG. 1. The structure shown in FIG. 3 represents a cross section of the acceleration sensor and is obtained through the processes shown in FIGS. 19 to 26. In FIG. 3, the sealing portion 31, the thin film structure 28, and the wiring 26 are shown. Also shown in FIG. 3 are the locations of the dicing lines a. In the present embodiment, the dicing line a is located along a side face of the sealing portion 31, as shown in FIG. 3. The third insulating film 23 is exposed at the locations of the dicing lines a.

Figure 4:
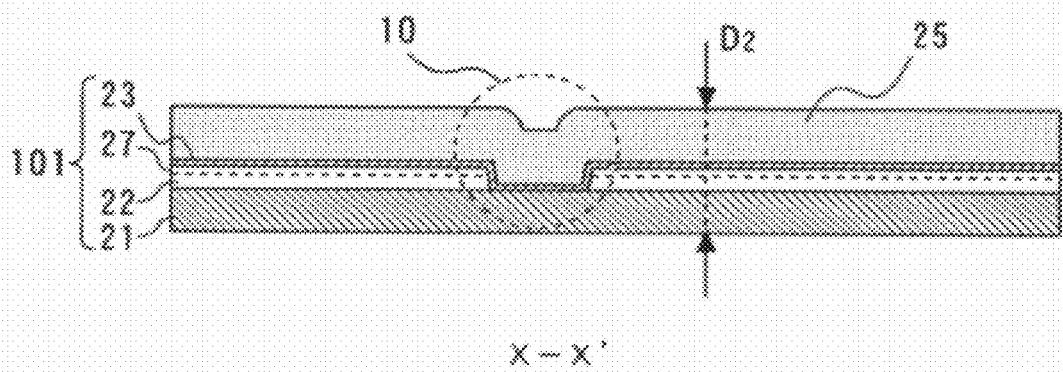
FIG. 4 is a cross-sectional view of the element wafer taken along the line X-X' of FIG. 1.

FIG. 4 is a cross-sectional view of the element wafer 2 taken along the line X-X' of FIG. 1. FIG. 4 shows a cross-sectional structure of the region C, which is the region present on the outer side of the element wafer 2. As shown in FIG. 4, the recessed portion 10 is formed in the region C by removing a portion of the first insulating film 22 and a portion of the second insulating film 27. Referring back to FIG. 1, the recessed portion 10 surrounds the formation region 6. When a crack occurs in the outer region of the element wafer 2 and propagates to a central side of the element wafer 2, the crack eventually reaches the recessed portion 10. In this case, the recessed portion 10 can prevent the propagation of the crack.

The element wafer according to the first embodiment is capable of preventing a crack from propagating into the formation region 6 to protect the acceleration sensors 20 from the crack.

[Manufacturing Method of the First Embodiment]

Next, a description will be made of the manufacturing method of the first embodiment. The manufacturing method of the first embodiment is a manufacturing method in which a process for forming the recessed portion 10 is added to the manufacturing method described as the premise of the embodiments of the present invention. By the manufacturing method of the present embodiment, the element wafer 2 described with reference to FIGS. 1 to 4 can be obtained.

Figure 5:
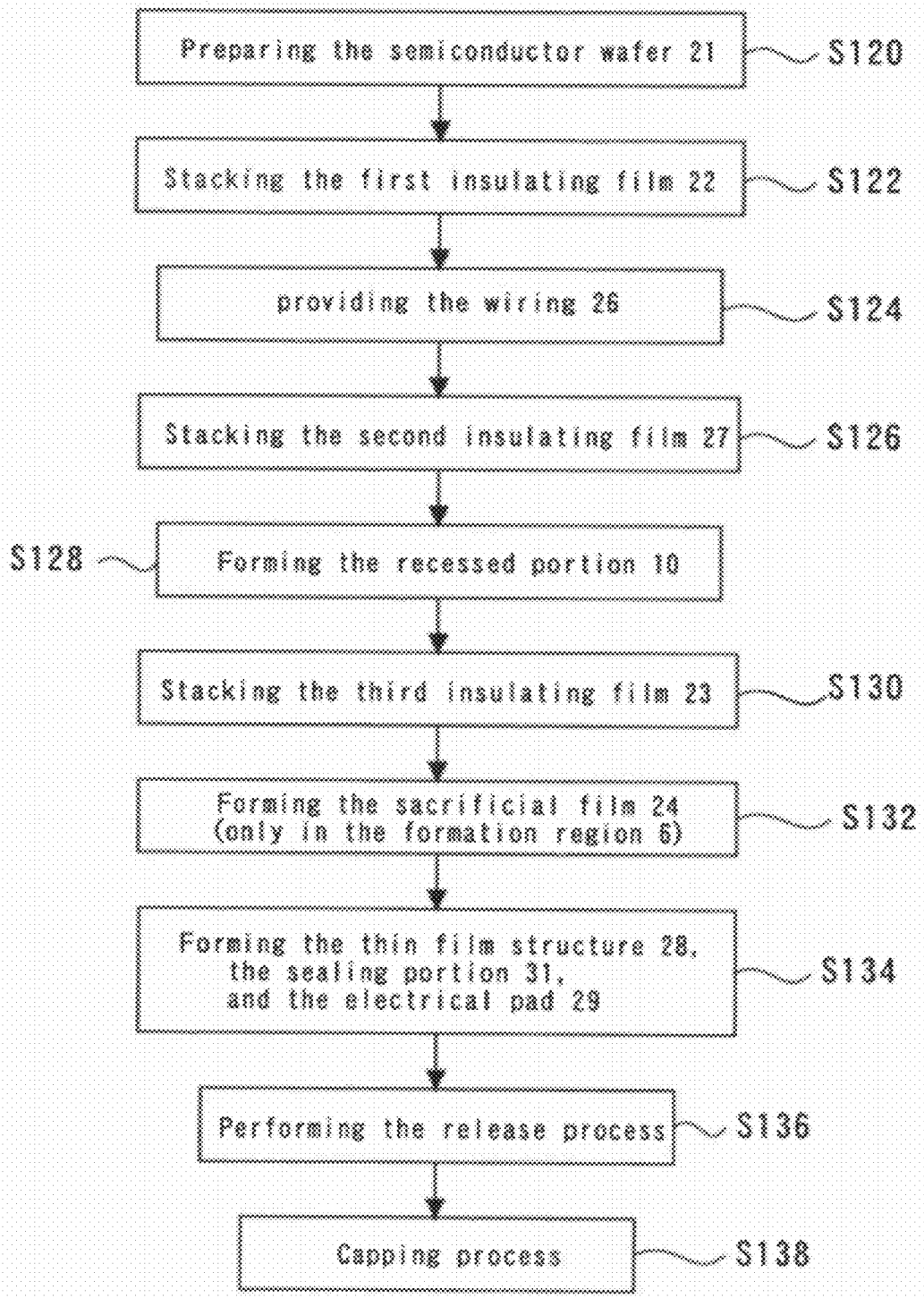
FIG. 5 is a flowchart showing the manufacturing method of the first embodiment.

FIG. 5 is a flowchart showing the manufacturing method of the first embodiment. First, the semiconductor wafer 21 is prepared in step S120 as shown in FIG. 5. Next, the first insulating film 22 is stacked on the semiconductor wafer 21 in step S122. Then, the wiring 26 is provided on the first insulating film 22 in step S124. After that, the second insulating film 27 is stacked in step S126. After a planarization process is performed onto the resulting structure, a structure with the wiring embedded is formed. The above-mentioned processes in steps S120 to S126 are the same as the processes described with reference to FIGS. 19 and 20 in the manufacturing method described as the premise.

Figure 6:
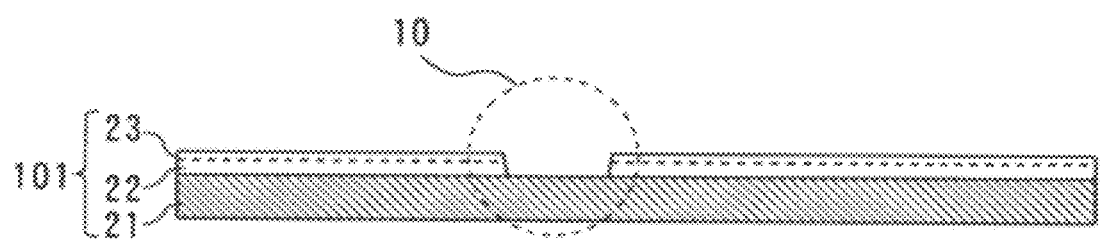
FIG. 6 is a diagram showing a process for forming a recessed portion of the first embodiment.
Figure 7:
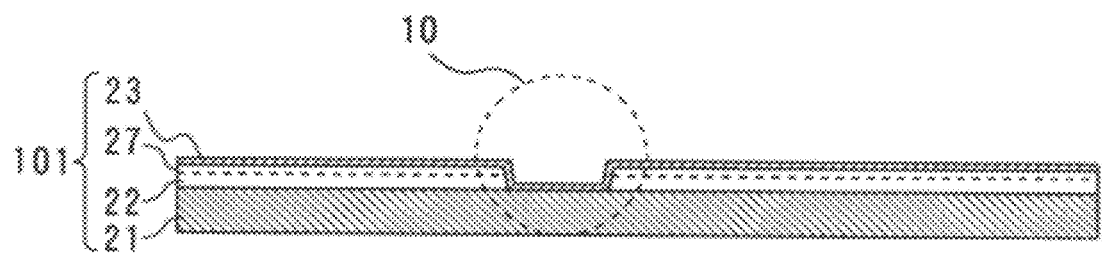
FIG. 7 is a diagram showing a process for forming the recessed portion of the first embodiment.

Next, the recessed portion is formed in step S128. FIGS. 6 and 7 show a process for forming the recessed portion 10 and are cross-sectional views of a region of the semiconductor wafer 21 taken along the line X-X' of FIG. 1. In the present embodiment, the recessed portion 10 is formed in the region C in step S128 after the second insulating film 27 is stacked in step S126.

In the present embodiment, the recessed portion 10 has a continuous linear pattern extending along the outer shape of the formation region 6. Based on the pattern of the recessed portion 10 shown in FIG. 1, a portion of the first insulating film 22 and a portion of the second insulating film 27 are selectively removed by wet and dry etching. By the wet and dry etching, the recessed portion 10 shown in FIG. 6 is formed.

After the formation of the recessed portion 10, a nitride film is stacked on the second insulating film 27 in step S130. The nitride film serves as the third insulating film 23. At this stage, the structure shown in FIG. 21 is formed in the formation region 6, and the structure shown in FIG. 7 is formed in the region C.

Then, the sacrificial film 24 is formed only in the formation region 6 in step S132. In this process, the sacrificial film 24 is first stacked above the entire upper surface of the semiconductor wafer 21. As a result, the structure shown in FIG. 22 is obtained in the formation region 6. After that, a portion of the sacrificial film 24 which is present outside of the formation region 6 (i.e., which is present in the region C) is removed by etching. In the etching for removing the portion of the sacrificial film 24 in the region C, a mask for forming anchor holes is used. Also used in the etching is the same etching method as that used in forming the anchor holes. Thus, the etching is performed also to form the anchor holes. As a result of the above-mentioned processes, the sacrificial film 24 remains only in the formation region 6, and the anchor holes are formed as shown in FIG. 23.

Then, the thin film structure 28, the sealing portion 31, and the electrical pad 29 are formed in step S134. In step S134, the structural thick film, which is a material of the thin film structure 28, is first stacked above the semiconductor wafer 21 after step S132. Specifically, the structural thick film is stacked on the structure shown in FIG. 23 in the formation region 6, while the structural thick film is stacked on the structure shown in FIG. 7 in the region C.

The structural thick film stacked in the formation region 6 and the region C has a thickness of several μm to several tens of am. At the stage in which the structural thick film is stacked, the stacked films have a particularly large internal stress. In such a case, a crack may occur to develop in any of the stacked films from the outer side of the semiconductor wafer 21. In the manufacturing method of the first embodiment, however, the recessed portion 10, which surrounds the formation region 6, is provided before the formation of the structural thick film. Even when a crack occurs, the formation region 6 is reliably protected by the recessed portion 10.

After that, the structural thick film present in the formation region 6 is processed by etching or the like, thereby forming the thin film structure 28 as shown in FIG. 24. On the other hand, in the region C, the structural thick film covers the recessed portion 10 as the conductive film 25. As a result, the structure shown in FIG. 4 is formed in the region C. In the formation region 6, thereafter, the electrical pad 29 is formed as described with reference to FIGS. 25 and 26.

Then, the release process is performed in step S136. In the release process, the sacrificial film 24 is removed. As a result of the removal, the element wafer 2 is formed as shown in FIGS. 1 to 4. It should be noted that the third insulating film 23 in the first embodiment functions as a stopper for the etching during the process for removing the sacrificial film 24.

Figure 8:
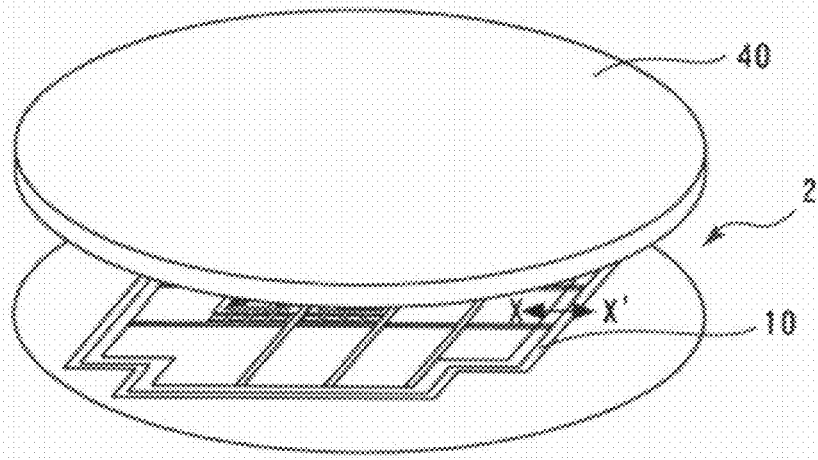
FIG. 8 is a diagram to describe a capping process of the first embodiment.
Figure 9:
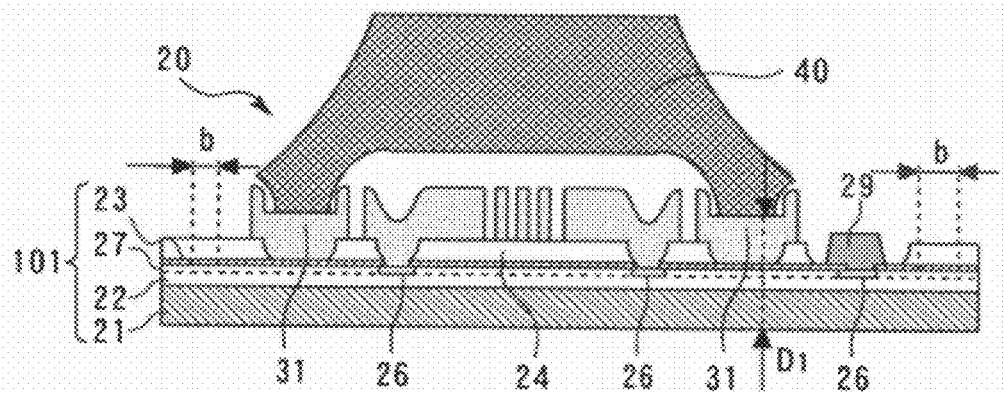
FIG. 9 is a diagram to describe a capping process of the first embodiment.
Figure 10:
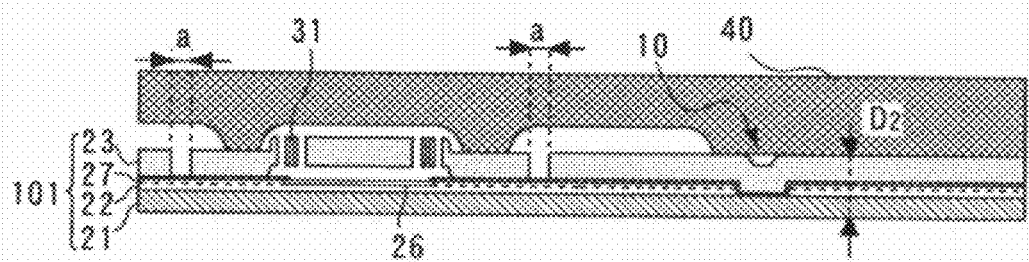
FIG. 10 is a diagram to describe a capping process of the first embodiment.

In the first embodiment, a capping process is performed on the element wafer 2 in step S138. FIGS. 8 to 10 are diagrams showing the capping process. As shown in FIG. 8, a cap plate 40 is attached to the element wafer 2, which is obtained after the release process is performed in step S136. The cap plate 40 is a plate composed of a plurality of aligned cap members, each of which caps a single acceleration sensor 20. When the cap plate 40 is attached to the element wafer 2, the cap members cover respective acceleration sensors 20 formed in the formation region 6 of the element wafer 2.

FIG. 9 is a cross-sectional view of the cap plate 40 and the element wafer 2 taken along the line A-A' of FIG. 1 and shows the state in which the cap plate 40 is attached to the element wafer 2. FIG. 10 is a cross-sectional view of the cap plate 40 and the element wafer 2 taken along the line X-X' of FIG. 1 and shows the state in which the cap plate 40 is attached to the element wafer 2. The adjacent cap members of the cap plate 40 are not continuous when they are viewed in the directions of the line B-B' of FIG. 1, as shown in FIG. 9. On the other hand, the adjacent cap members of the cap plate 40 are continuous when they are viewed in the directions of the line A-A' of FIG. 1, as shown in FIG. 10. In other words, each of the cap members of the cap plate 40 is connected along the line B-B' of FIG. 1. The structure of the cap plate 40 is not described further in detail in the present specification.

As apparent from FIGS. 9 and 10, the sealing portion 31 of the acceleration sensor 20 and the laminated structure present in the region C are in contact with the cap plate 40. According to the manufacturing method of the first embodiment, the sealing portion 31 and the laminated structure present in the region C can serve as adhesives for fixing the cap plate 40.

After that, the element wafer 2 and the cap plate 40 are diced along the dicing lines a and b, which are also shown in FIGS. 9 and 10. As a result, the acceleration sensors 20 capped with the cap plate 40 are obtained.

As described above, according to the manufacturing method of the first embodiment, the recessed portion 10 surrounding the formation region 6 is formed while the plurality of films (the first insulating film 22, the second insulating film 27, the third insulating film 23, and the structural thick film) are stacked on the semiconductor wafer 21. The formation region 6 is a region of the films in which the acceleration sensor 20 is located (or is to be located). The recessed portion 10 serves to prevent a crack from propagating into the formation region 6 in which the elements are present even when the crack occurs to develop in two or more of the films from the outer side of the semiconductor wafer 21. In the first embodiment, the recessed portion is not formed in the semiconductor wafer 21 itself but formed in the films which are stacked on the semiconductor wafer 21. This technique enables avoiding complex processes and preventing a crack from damaging the elements.

To form a thin film structure having the support portion and the floating portion, it is necessary that the structural thick film and the sacrificial film have sufficient thicknesses. Thus, in the processes for forming the acceleration sensor, a plurality of films (including the insulating film, the conductive film, and the sacrificial film) with mutually-different materials and thicknesses are stacked on the semiconductor wafer. Especially in the process for stacking the structural thick film having a relatively large thickness, there is a high possibility that a crack may occur in the outer region of the semiconductor wafer. According to the first embodiment, the recessed portion 10 can be formed before the process for stacking the structural thick film. When a crack occurs during or after the process for stacking the structural thick film, therefore, the recessed portion can reliably prevent the crack from affecting the structure of each element. Thus, the acceleration sensors can be manufactured at a high yield.

The stacked structural thick film having a thickness of several μm to several tens of μm has a large stress and gives a part of the stress to the films provided under the structural thick film. Due to the stress present in the structural thick film, there is a possibility that a crack may occur in the first to third insulating films 22, 27 and 23. The first insulating film 22 has a relatively large thickness of approximately 2 μm. It is thus considered that the first insulating film 22 tends to propagate a crack; there is concern that the first insulating film 22 may become a medium for propagating the crack. According to the first embodiment, however, the recessed portion 10 is formed by removing portions of the first and second insulating films 22 and 27 by etching until the surface of the semiconductor wafer 21 is exposed. Therefore, the recessed portion 10 can reliably prevent a crack from propagating from the outer side of the semiconductor wafer 21 through the first and second insulating films 22 and 27 to the region in which the elements are present.

In the first embodiment, the recessed portion 10 is formed by etching the first and second insulating films 22 and 27, which are oxide films. The third insulating film 23, a nitride film, is then stacked after the etching. As described above, the third insulating film 23 functions as a stopper for the etching during the process of removing the sacrificial film 24. If the recessed portion 10 is formed by the etching after the formation of the third insulating film 23, the third insulating film 23, which is to function as a stopper for the etching, may be damaged. In contrast, the recessed portion 10 according to the first embodiment can prevent an adverse effect of a crack on the elements without preventing the third insulating film 23 from functioning as a stopper for the etching.

According to the manufacturing method of the first embodiment, the recessed portion 10 is formed while portions of the first and second insulating films 22 and 27 remain on the outer side of the semiconductor wafer 21 (in the region C). After that, the third insulating film 23 is stacked on the remaining portion of the second insulating film 27, and the structural thick film is then stacked on the third insulating film 23 in the region C. In this technique, the recessed portion 10 surrounds the formation region 6 to prevent a crack from propagating into the region in which the elements are present, while the films remain in the region C to serve eventually as an adhesive for the cap plate 40. According to the first embodiment, two types of demands are satisfied: one is that measures need to be taken for a crack occurring in any of films on the outer side of the semiconductor wafer; and the other is that a film needs to be stacked as an adhesive for the cap plate on the outer side of the semiconductor wafer.

According to the first embodiment, the process in step S120 of FIG. 5, corresponds to "a process for preparing a semiconductor wafer" according to the above-described first aspect of the present invention; the processes in steps S122, S124, S126, S130, S132 and S134 correspond to "a process for forming an element" according to the first aspect of the present invention; the process in step S128 corresponds to "a process for forming a recessed portion and/or a plurality of openings in at least one of the plurality of films, the recessed portion and the plurality of openings being arranged outside the central region and surrounding the central region" according to the first aspect of the present invention; and the first and second insulating films 22 and 27 correspond to "at least one of the plurality of films" according to the first aspect of the present invention.

In the element wafer 2 according to the first embodiment, the semiconductor wafer 21 corresponds to "a semiconductor wafer" according to the above-described third aspect of the present invention; the first, second and third insulating films 22, 27 and 23 correspond to "a film stacked on the semiconductor wafer" according to the third aspect of the present invention; the acceleration sensors 20 correspond to "an element" according to the third aspect of the present invention; the films located between the first insulating film 22 and the conductive film 25 including those films shown in FIG. 4 correspond to "a plurality of films" according to the third aspect of the present invention; the recessed portion 10 corresponds to "a recessed portion" according to the third aspect of the present invention; the formation region 6 corresponds to "the central region" according to the third aspect of the present invention; and the region C corresponds to "a region on the outer side of the semiconductor wafer" according to the third aspect of the present invention.

[Modifications of the First Embodiment]
(First Modification)

In the first embodiment, the recessed portion 10 is formed by etching the first and second insulating films 22 and 27. The present invention, however, is not limited to the above process for forming the recessed portion 10. In the first modification, the recessed portion may be formed in one or more of the films stacked on the semiconductor wafer 21 to surround the formation region 6. For example, after the third insulating film 23 is formed, etching may be performed on the first, second and third insulating films 22, 27 and 23 in the first embodiment.

(Second Modification)

Figure 11A:
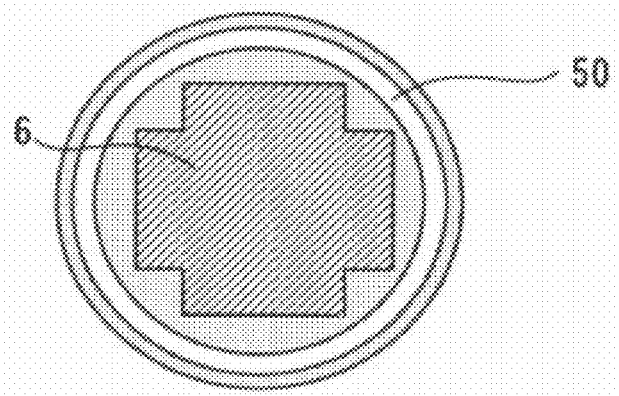
FIG. 11 is a diagram showing a modification of the first embodiment.

In the first embodiment, the recessed portion 10 extends along the outer shape of the formation region 6. The present invention, however, is not limited to the above shape of the recessed portion 10. Referring to FIG. 11A, the recessed portion 10 may be replaced with a recessed portion 50 having a curved line extending along the circumference of the semiconductor wafer 21.

Figure 11B:
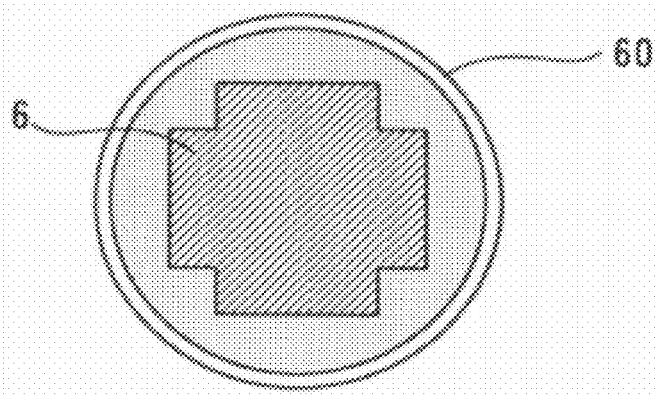

In the first embodiment, the recessed portion 10 is provided relatively internally from the edge of the semiconductor wafer 21. However, the recessed portion 10 may be replaced with a recessed portion 60 located along the edge of the semiconductor wafer 21 as shown in FIG. 11B. In the structure shown in FIG. 11B, a step (the recessed portion 60) is formed along the edge of the semiconductor wafer 21. The recessed portion according to the present invention also includes such a structure as shown in FIG. 11B.

Figure 11C:
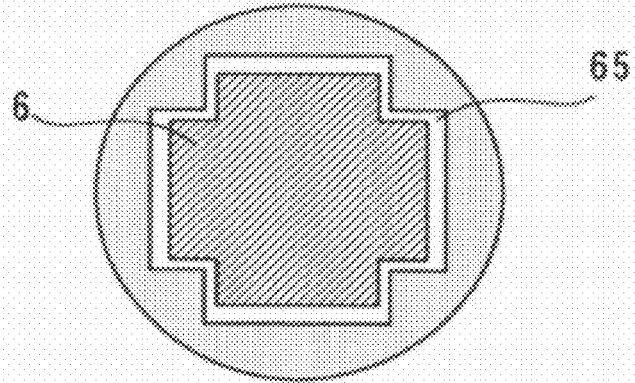

Referring to FIG. 11C, the recessed portion 10 may be replaced with a recessed portion 65 extending along the outline of the formation region 6 (along the boundary between the formation region 6 and the region C). In this case, the recessed portion 65 is located on the dicing lines extending along the outline of the formation region 6.

(Third Modification)

Figure 12:
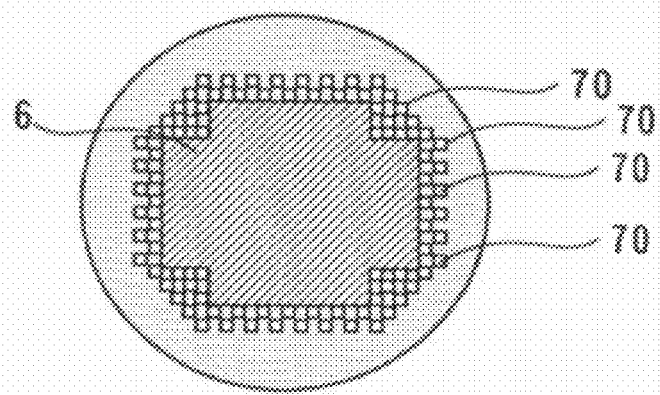
FIG. 12 is a diagram showing a modification of the first embodiment.

Referring to FIG. 12, the recessed portion 10 of the first embodiment may be replaced with a plurality of openings 70 surrounding the formation region 6. In the third modification, each of the openings 70 is connected with ones adjacent thereto. As with the recessed portion of the first embodiment, the thus-configured openings 70 can prevent a crack occurring in any of the films from the outer side of the semiconductor wafer 21 from propagating into the formation region 6 when the crack reaches the openings 70. In order to form a semiconductor wafer according to the third modification, the process in step S128 shown in FIG. 5 may be replaced with a process for forming the openings 70. Specifically, the pattern of a mask to be used for etching needs to be designed to form the plurality of openings 70 surrounding the formation region 6 as shown in FIG. 12. In FIG. 12, the openings 70 are provided in a grid form to surround the formation region 6 in a multiple manner. The arrangement of the openings 70, however, is not limited to the one shown in FIG. 12. For example, the openings 70 may be arranged so as to surround the formation region 6 once. The contour of each of the openings 70 is not limited to the rectangular form as shown in FIG. 12, but may be in various other forms.

In the first embodiment, the portions of the first and second insulating films 22 and 27 are removed by the etching for the formation of the recessed portion 10 until the surface of the semiconductor wafer 21 is exposed. However, a part of the portion of the first insulating film 22 may remain in a region corresponding to a bottom surface of the recessed portion 10 (in other words, a part of the portion of the first insulating film 22 may remain on the upper surface of the semiconductor wafer 21).

In recent years, after elements such as acceleration sensors are formed above semiconductor wafers, business transactions involving sales of the wafers have been performed without dicing the wafer. The element wafer 2 can be provided for such business transactions. According to the first embodiment, the element wafer 2 having the cap plate 40 attached thereto can also be provided for such business transactions.

In the first embodiment, the element wafer 2 is manufactured according to the method described with reference to the flowchart shown in FIG. 5. The element wafer according to the present invention, however, may be manufactured according to a method other than the method described with reference to the flowchart in FIG. 5. This results from the fact that the recessed portion formed in such a way as to surround the formation region can prevent a crack from propagating into the formation region irrespective of its manufacturing method.

Second Embodiment

In the first embodiment, the recessed portion 10 surrounds the formation region 6 and prevents a crack from propagating into the formation region 6. In a second embodiment of the present invention, other recessed portions are provided within the formation region 6 to prevent a crack from spreading within the formation region 6.

[Construction of the Element Wafer According to the Second Embodiment]

Figure 13:
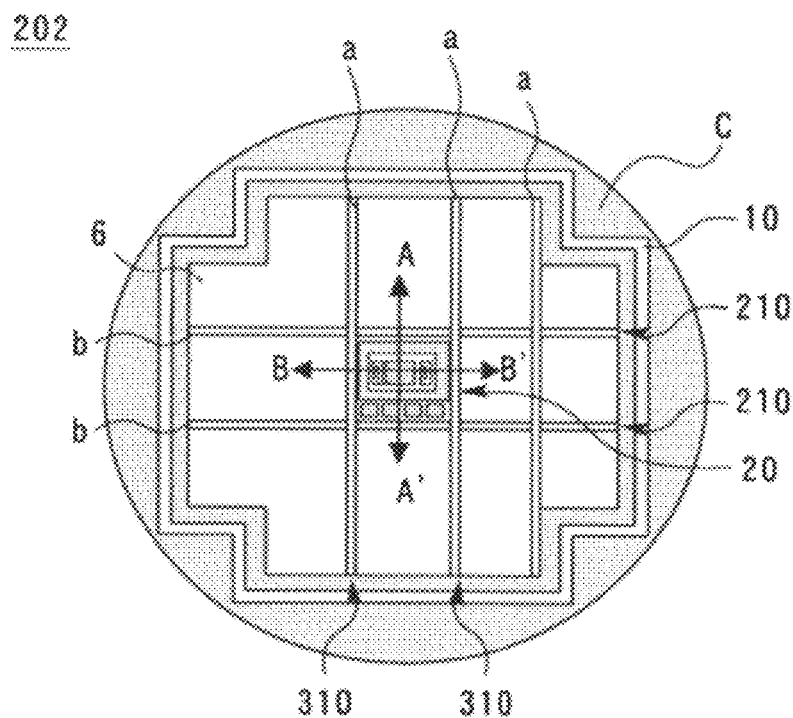
FIG. 13 is a plan view of an element wafer according to the second embodiment.

FIG. 13 is a plan view of an element wafer 202 according to the second embodiment. In the second embodiment, recessed portions 210 are provided along the respective dicing lines b, and recessed portions 310 are provided along the respective dicing lines a. The other components of the element wafer 202 are the same as those of the element wafer 2 in the first embodiment. In FIG. 13, only a single acceleration sensor 20 is shown. In the formation region 6 of the element wafer 202, however, a plurality of the acceleration sensor 20 is provided.

In the second embodiment, a plurality of the recessed portions 210 extends in the directions of the line B-B' of FIG. 13, and a plurality of the recessed portions 310 extends in the directions of the line A-A' of FIG. 13. That is, the recessed portions 210 extend along the respective dicing lines b, and the recessed portions 310 extend along the respective dicing lines a. It should be noted that only a couple of the recessed portions are shown for the sake of convenience. Each of the acceleration sensors 20 is completely partitioned by two of the recessed portions 210 and two of the recessed portions 310.

Figure 14:
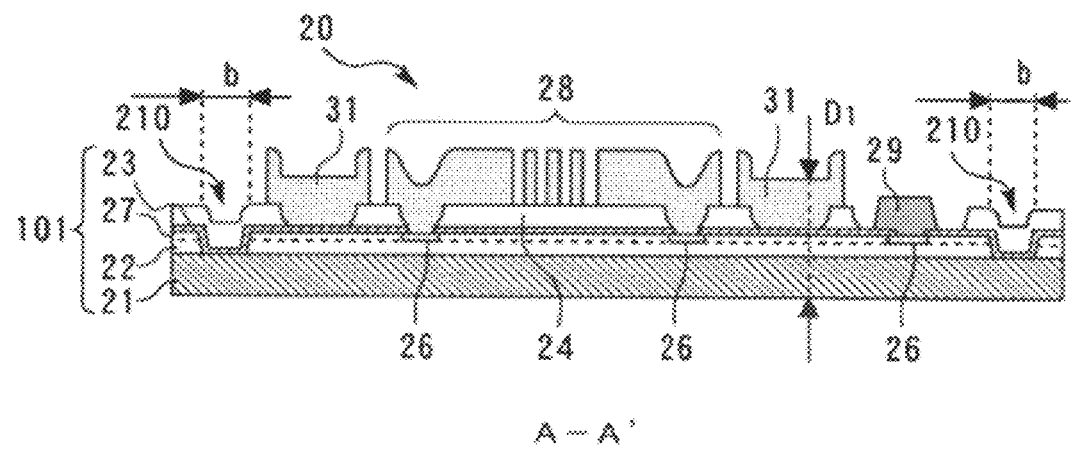
FIG. 14 is a cross-sectional view of the element wafer taken along the line A-A' of FIG. 13.

FIG. 14 is a cross-sectional view of the element wafer 202 taken along the line A-A' of FIG. 13 and shows the acceleration sensor 20 and the dicing lines b, which are located on both sides of the acceleration sensor 20. In the second embodiment, the recessed portions 210 are provided along the respective dicing lines b. Specifically, each of the recessed portions 210 is formed by removing a portion of the first insulating film 22 and a portion of the second insulating film 27 both of which are located at the dicing line b.

Figure 15:
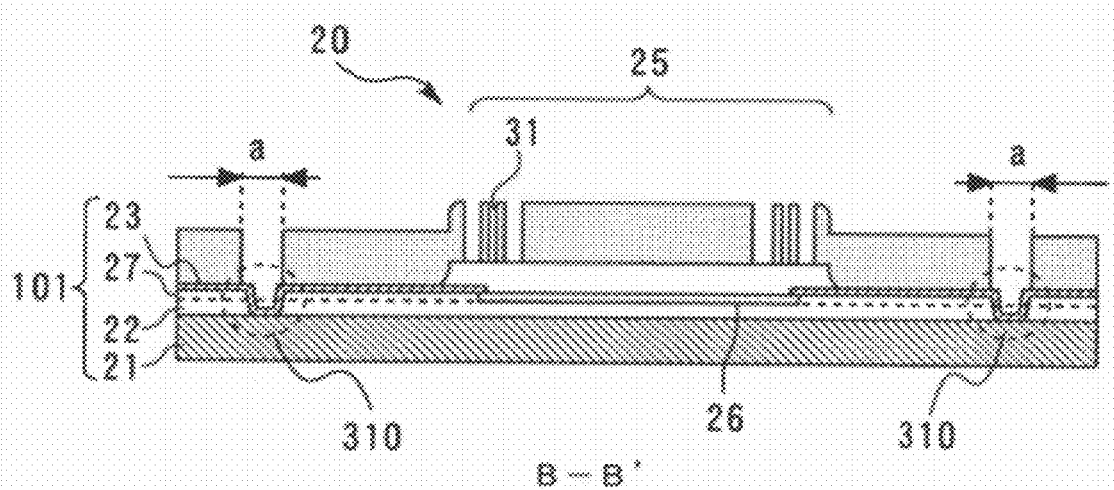
FIG. 15 is a cross-sectional view of the element wafer taken along the line B-B' of FIG. 13.

FIG. 15 is a cross-sectional view of the element wafer 202 taken along the line B-B' of FIG. 13 and shows the acceleration sensor and the dicing lines a, which are located on both sides of the acceleration sensor 20. In the second embodiment, the recessed portions 310 are provided along the respective dicing lines a. Specifically, each of the recessed portions 310 is formed by removing a portion of the first insulating film 22 and a portion of the second insulating film 27 both of which are located at the dicing line a.

The first and second insulating films 22 and 27 each have a function for supporting the thin film structure 28 of each of the acceleration sensors 20. Thus, the first and second insulating films 22 and 27 each tend to be formed to have a thickness of several µm to ensure their functions as the foundation of the thin film structure 28. As in the manufacturing method as the premise of the embodiments of the present invention, when the first insulating film 22 is formed on the entire surface of the semiconductor wafer 21 and the second insulating film 27 is formed on the entire surface of the first insulating film 22, the first and second insulating films 22 and 27 present in the region C on the outer side of the semiconductor wafer 21 are continuous with the first and second insulating films 22 and 27 present in the formation region 6, respectively. In this structure, when a crack propagates into the formation region 6, or when a crack occurs in the formation region 6, the crack may damage the acceleration sensors 20 present in the formation region 6 one after another due to the propagation of the crack.

In the second embodiment, therefore, the recessed portions 210 are provided along the respective dicing lines b in the formation region 6, and the recessed portions 310 are provided along the respective dicing lines a in the formation region 6. The recessed portions 210 and 310 can prevent a crack occurring in a region in which a certain acceleration sensor 20 is located from propagating into a region adjacent to that region and damaging another acceleration sensor 20 located in the adjacent region.

[Manufacturing Method of the Second Embodiment]

Figure 16:
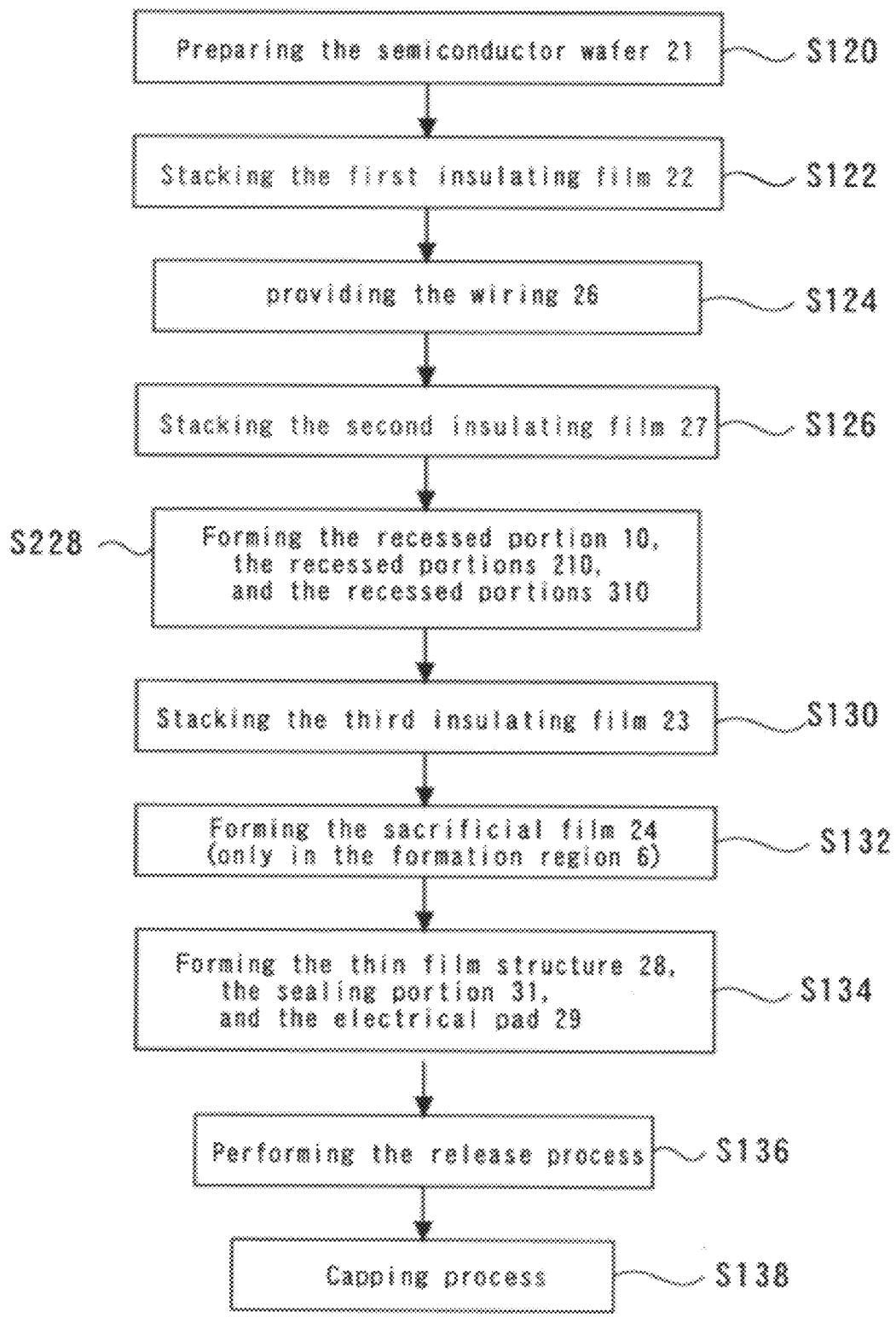
FIG. 16 is a flowchart showing the manufacturing method of the second embodiment.

FIG. 16 is a flowchart showing the manufacturing method of the second embodiment. The process in step S228 of the flowchart shown in FIG. 16 is different from the process in step S128 of the flowchart shown in FIG. 5. The other processes included in the flowchart shown in FIG. 16 are the same as those included in the flowchart shown in FIG. 5. In the manufacturing method of the second embodiment, the processes in steps 120, 122, 124 and 126 are first performed as in the first embodiment.

The recessed portions 10 is next formed outside the formation region 6, while the recessed portions 210 and 310 are formed in the formation region 6 (more specifically, in a region in which the wiring 26 is provided and under which the semiconductor wafer 21 is present, since the acceleration sensors 20 are not completed at this stage) in step S228. Specifically, portions of the first and second insulating films 22 and 27 that are present at locations of the dicing lines are removed by etching. The formation of the recessed portion 10 in the second embodiment is the same as that of the recessed portion 10 in the first embodiment. As in the first embodiment, the recessed portions 10, 210 and 310 can thus be provided to prevent a crack from spreading before the processes for stacking thick films having relatively large stresses, such as the sacrificial film 24 and the structural thick film. According to the second embodiment, in addition, in the process for the formation of the recessed portions 210 and 310, the first and second insulating films 22 and 27 are removed by etching until the surface of semiconductor wafer 21 is exposed.

After that, the processes in steps S130, S132 and S134 are performed as in the first embodiment. After the processes in steps S120 to S134 shown in FIG. 16, the element wafer 202 shown in FIGS. 13 to 15 is obtained. Then, the processes in steps S136 and S138 are performed as in the first embodiment. With the above processes, the element wafer 202 having the cap plate 40 attached thereto is eventually obtained. In the above-mentioned manufacturing method of the second embodiment, the recessed portions effective in preventing crack propagation can be formed in the element wafer 202 in a timely manner as in the first embodiment.

According to the second embodiment, the process in step S120, which is described with reference to FIG. 16, corresponds to "a process for preparing a semiconductor wafer" according to the above-described second aspect of the present invention; the processes in steps S122, S124, S126, S130, S132 and S134 correspond to "a process for forming an element" according to the second aspect of the present invention; the etching process in step S228 for forming the recessed portions 210 and 310 corresponds to "a process for forming recessed portions to partition elements from each other" according to the second aspect of the present invention; and the first and second insulating films 22 and 27 correspond to "at least one of the films" according to the second aspect of the present invention.

In the element wafer 202 according to the second embodiment, the semiconductor wafer 21 corresponds to "a semiconductor wafer" according to the fourth aspect of the present invention; the first and second insulating films 22 and 27 correspond to "a film" according to the fourth aspect of the present invention; the wiring 26 provided in a single acceleration sensor 20 corresponds to "wiring" according to the fourth aspect of the present invention; the thin film structure 28 corresponds to "a thin film structure" according to the fourth aspect of the invention; the recessed portions 210 and 310 correspond to "recessed portions" according to the fourth aspect of the present invention; and the formation region 6 corresponds to "the central region" according to the fourth aspect of the present invention.

[Modifications of the Second Embodiment]
(First Modification)

Figure 17:
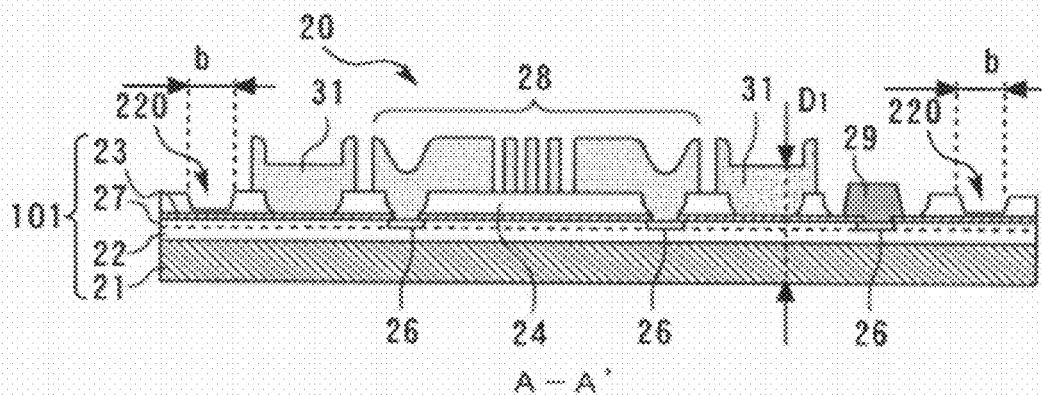
FIG. 17 is a diagram showing a modification of the first embodiment.

FIG. 17 is a diagram showing a first modification of the second embodiment. In the first modification of the second embodiment, recessed portions are provided only in the sacrificial film 24 (recessed portions 220 shown in FIG. 17). As described above, the sacrificial film 24 has a thickness of several μm (for example, 2 μm) and serves as a foundation for supporting the thin film structure 28 before the release process. If the sacrificial film 24 extends between the acceleration sensors 20 adjacent to each other in the directions of the line A-A' of FIG. 13, a crack tends to propagate between the acceleration sensors 20 adjacent to each other through the sacrificial film 24 having a large thickness. According to the first modification of the second embodiment, however, the recessed portions 220 are provided in the sacrificial film 24. Thus, the recessed portions 220 can prevent a crack from propagating between the acceleration sensors 20 adjacent to each other through the sacrificial film 24.

To manufacture the element wafer according to the first modification of the second embodiment, the process for forming the recessed portions 210 and 310 in step S228 needs to be performed after the process in step S132 of the flowchart shown in FIG. 16.

(Second Modification)

Figure 18:
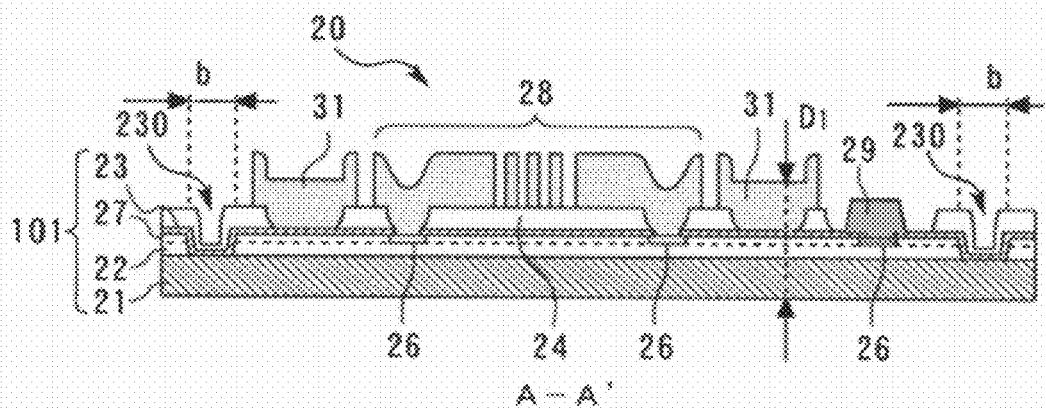
FIG. 18 is a diagram showing a modification of the first embodiment.

FIG. 18 is a diagram showing a second modification of the second embodiment. The second modification of the second embodiment is obtained by combining the second embodiment and the first modification of the second embodiment. According to the second modification of the second embodiment, recessed portions 230 are provided in the first and second insulating films 22 and 27. Portions of the sacrificial film 24 are stacked on the recessed portions 230 and have thicknesses smaller than those of other portions of the sacrificial film 24. The surfaces of the portions of the sacrificial film 24 which are located on the recessed portions 230 are thus positioned lower than the surface of the second insulating film 27. The thus-configured structure can prevent a crack from propagating within the sacrificial film 24 and within the first and second insulating films 22 and 27.

To achieve the element wafer according to the second modification of the second embodiment, the first etching process is performed in step S228 in the flowchart shown in FIG. 16, and the second etching process is performed on the same location after the process for stacking the sacrificial film 24 in step S130.

The element wafer 202 according to the second embodiment is provided with the recessed portion 10 surrounding the formation region 6 and the recessed portions 210 and 310 extending within the formation region 6. The present invention, however, is not limited to the structure of the element wafer 202; the element wafer 202 may be provided only with the recessed portion 210 and 310. The reason is that measures against crack propagation can still be achieved at least within the formation region 6 by the recessed portion 210 and 310.

In the second embodiment, the recessed portions 210 and 310 are provided at the locations of the dicing lines b and a, respectively in the formation region 6. The present invention, however, is not limited to the above-mentioned arrangements of the recessed portions 210 and 310. The element wafer may be provided with recessed portions extending along either of the dicing lines a or b. That is, the element wafer 202 may be provided with either the recessed portions 210 or 310. When only the recessed portions 210 are provided, the first and second insulating films 22 and 27 extend between the acceleration sensors 20 adjacent to each other in the directions of the line B-B' of FIG. 13. In this case, the recessed portions 210 are provided to partition the acceleration sensors 20 only along the dicing lines b.

In the second embodiment, the recessed portions 210 and 310 extend straight along the dicing lines b and a in the formation region 6, respectively. The present invention, however, is not limited to those arrangements of the recessed portions 210 and 310. Typically, a plurality of dicing lines crosses each other in the formation region 6. Thus, the recessed portions 210 and 310 may extend, changing their directions at the intersections of the dicing lines a and b. For example, the recessed portions 210 and 310 may extend to planarly form a rectangular shape in the formation region 6.

In the second embodiment, the element wafer 202 is manufactured according to the method described with reference to the flowchart shown in FIG. 16. The element wafer according to the present invention may be manufactured according to a method other than the manufacturing method described with reference to the flowchart shown in FIG. 16. This results from the fact that the recessed portions formed to extend along the respective dicing lines can prevent a crack from spreading within the formation region irrespective of their manufacturing methods.

The first and second embodiments are based on the assumption that elements to be formed on the semiconductor wafer are acceleration sensors. The present invention, however, is not limited to the acceleration sensors. In the present invention, various elements having minute structures (so-called micro electro mechanical systems (MEMS) elements) may be formed on the semiconductor wafer. In the manufacturing method of the first embodiment, the recessed portion 10 is formed before the process for stacking the structural thick film since a crack may occur during the process for stacking the structural thick film, which is the material of the thin film structure 28. The present invention, however, is applicable to a method other than the manufacturing method described as the premise of the embodiments of the present invention. For example, after all the films are stacked on the semiconductor wafer, the recessed portions 10, 210 and 310 may be formed. As described in the embodiments, the present invention is not limited to the manufacturing method described as the premise of the embodiments. The present invention is applicable to various methods. In a typical one of the various methods to which the present invention is applicable, a plurality of films are stacked on the semiconductor wafer and processed immediately after the process for stacking each film (in other words, the processing and the film-stacking are alternately performed) to form elements having minute structures.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-067786, filed on Mar. 17, 2008 including specification, claims, drawings and summary, on which the Convention priority of the present application is based, are incorporated herein by reference in its entirety.

What is claimed is:

1. An element wafer comprising:
a semiconductor wafer;
a film stacked on the semiconductor wafer; and
plural elements provided on a central region of the film stacked on the semiconductor wafer and laterally spaced from each other to be diced into separated elements; wherein
a plurality of films including said film are stacked in the outer region of the semiconductor wafer, the outer region being located outside of the central region,
a recessed portion and/or a plurality of openings are provided in at least one of the films stacked in the outer region of the semiconductor wafer, the recessed portion and/or the plurality of openings being arranged outside the central region and surrounding the central region, and
no said elements are provided in the outer region of the semiconductor wafer extending from outside the central region to the peripheral edge of the wafer.

2. The element wafer according to claim 1, wherein
each plural element is an acceleration sensor having wiring, a thin film structure, and a protrusion, the thin film structure including a support portion and a floating portion, the support portion being connected with the wiring, the floating portion being supported by the support portion and movable, the protrusion surrounding the thin film structure, and
an other film is stacked on said film in the outer region of the semiconductor wafer, and the upper surface of the protrusion is substantially flush with the upper surface of the other film stacked on the film in the outer region of the semiconductor wafer.

3. The element wafer according to claim 1, wherein
other recessed portions are provided in the central region of the plurality of films stacked on the semiconductor wafer to partition the elements from each other.

4. The element wafer according to claim 3, wherein
the other recessed portions to partition the elements are provided in such a way as to cross each other in the central region in which the elements are formed.

5. A capped element wafer comprising:
an element wafer according to claim 1; and
a cap plate having a cap member for capping each of the elements; wherein
the cap plate is fixed to the element wafer under the condition that the cap plate is in contact with the upper surface of the top film of the plurality of films provided in the outer region of the semiconductor wafer and with the upper surface of protrusions surrounding each element.

6. The element wafer according to claim 1, wherein the recessed portion and/or plurality of openings provided in at least one of the films stacked in the outer region has a thickness less than a thickness of the at least one film adjacent to the recessed portion and/or plurality of openings.

7. The element wafer according to claim 1, wherein each of the plural elements is an acceleration sensor or structure of an acceleration sensor.

8. An element wafer comprising:
a semiconductor wafer;
an insulating film stacked on the semiconductor wafer;
plural pieces of wiring provided on a central region of the insulating film stacked on the semiconductor wafer;
a sacrificial film stacked on the insulating film and the wiring and having a plurality of openings formed therein, the opening exposing the respective pieces of the wiring; and
a plurality of thin film structures provided on the sacrificial film and connected with the respective pieces of the wiring through the openings,
wherein
recessed portions are provided in the sacrificial film to partition the thin film structures from each other, and
the sacrificial film has a thickness at the recessed portion less than a thickness of the sacrificial film adjacent to the recessed portion.

9. An element wafer, comprising:
a semiconductor wafer;
an insulating film stacked on the semiconductor wafer;
plural pieces of wiring provided on a central region of the insulating film stacked on the semiconductor wafer; and
a plurality of thin film structures provided on and connected with the respective pieces of the wiring, each of the plurality of thin film structures including at least one portion movable relative to the semiconductor wafer, wherein
recessed portions are provided in the insulating film to partition the thin film structures from each other, and
the insulating film has a thickness at the recessed portion less than a thickness of the film adjacent to the recessed portion.

* * * * *